United States Patent [19]

Hyde et al.

[11] Patent Number: 4,866,387
[45] Date of Patent: Sep. 12, 1989

[54] NMR DETECTOR NETWORK

[75] Inventors: James S. Hyde, Dousman, Wis.; Wojciech Froncisz, Krakow, Poland; Andrzej Jesmanowicz, Wauwatosa; J. Bruce Kneeland, Fox Point, both of Wis.

[73] Assignee: MCW Research Foundation, Inc., Milwaukee, Wis.

[21] Appl. No.: 148,257

[22] Filed: Jan. 25, 1988

Related U.S. Application Data

[63] Continuation-in-part of Ser. No. 897,177, Aug. 15, 1986, Pat. No. 4,721,913, which is a continuation-in-part of Ser. No. 731,923, May 8, 1985, Pat. No. 4,724,389.

[51] Int. Cl.⁴ ............................................. G01R 33/20
[52] U.S. Cl. ................................................... 324/318
[58] Field of Search ................ 324/316, 318; 128/653; 333/219, 230, 235

[56] References Cited

U.S. PATENT DOCUMENTS

| | | | |
|---|---|---|---|
| 3,932,805 | 1/1976 | Abe et al. | 324/0.5A |
| 3,949,388 | 4/1976 | Fuller | 340/189 |
| 4,394,645 | 7/1983 | Humble et al. | 340/572 |
| 4,417,209 | 11/1983 | Hounsfield | 324/309 |
| 4,435,680 | 3/1984 | Froncisz et al. | 324/316 |
| 4,446,429 | 5/1984 | Froncisz et al. | 324/316 |
| 4,467,282 | 8/1984 | Siebold | 324/309 |
| 4,480,239 | 10/1984 | Hyde et al. | 333/219 |
| 4,504,788 | 3/1985 | Froncisz et al. | 324/316 |
| 4,570,137 | 2/1986 | DiSilvestro | 333/219 |
| 4,607,225 | 8/1986 | Crooks | 324/318 |
| 4,636,730 | 1/1987 | Bottomley | 324/318 |
| 4,717,880 | 1/1988 | Ono et al. | 324/318 |
| 4,721,913 | 1/1988 | Hyde et al. | 324/318 |
| 4,724,389 | 2/1988 | Hyde et al. | 324/318 |
| 4,725,779 | 2/1988 | Hyde et al. | 324/318 |
| 4,733,190 | 3/1988 | Dembinski | 324/318 |
| 4,734,647* | 3/1988 | Yoshimura | 324/318 |
| 4,758,789 | 7/1988 | Ono et al. | 324/316 |

FOREIGN PATENT DOCUMENTS 2448544 5/1975 Fed. Rep. of Germany.
2159958A 12/1985 United Kingdom.

OTHER PUBLICATIONS

Article by Richard E. Halbach et al., entitled "The NMR blood flowmeter-design", Med. Phys. 8(4), Jul.-/Aug. 1981, pp. 444-451.
Article by J. H. Battocletti et al., entitled "Nuclear Magnetic Resonance and Transcutaneous Electromagnetic Blood Flow Measurement", Journal of Microwave Power, 18(3), 1983, pp. 221-232.
Article by J. H. Battocletti et al., entitled "Flat crossed-coil detector for blood flow measurement using nuclear magnetic resonance", Medical & Biological Engineering & Computing, 1979, 17, pp. 183-191.

Primary Examiner—Stewart J. Levy
Assistant Examiner—Kevin D. O'Shea

[57] ABSTRACT

Counter Rotating Current (CRC) pairs of loop-gap resonators are combined with planar pairs of loop-gap resonators to form networks of NMR local coils. A first embodiment is a quadrature probe in which a planar pair is sandwiched between the loop-gap resonators of the CRC pair. In a plurality of other embodiments, CRC pairs, planar pairs, and other types of local coils are arranged adjacent to one another to form networks of NMR local coils with an enlarged net region of sensitivity. In a further embodiment of the invention, an excitation coil operated in an excite/receive mode is combined with intrinsically isolated local detectors to form an NMR detection network.

18 Claims, 7 Drawing Sheets

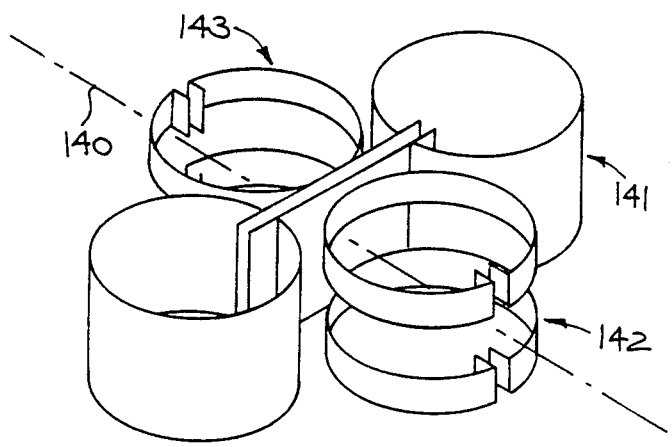
FIG. 5A
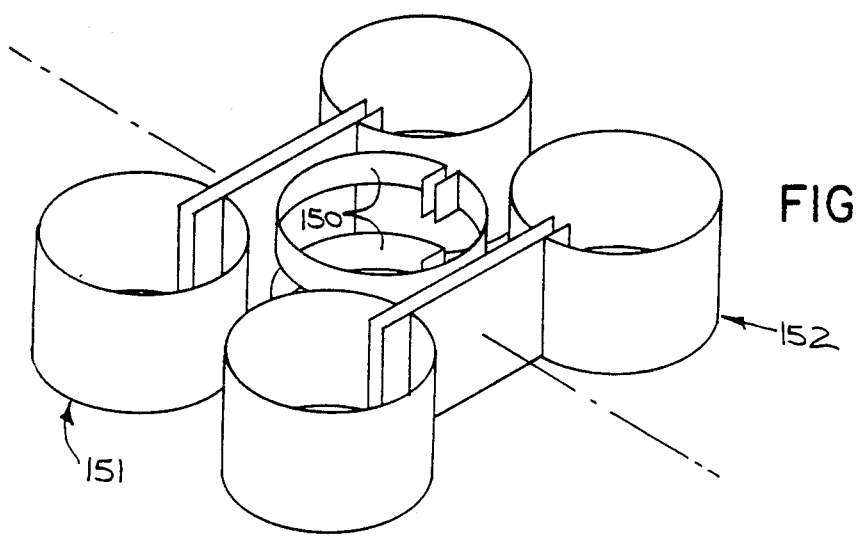
FIG. 5B
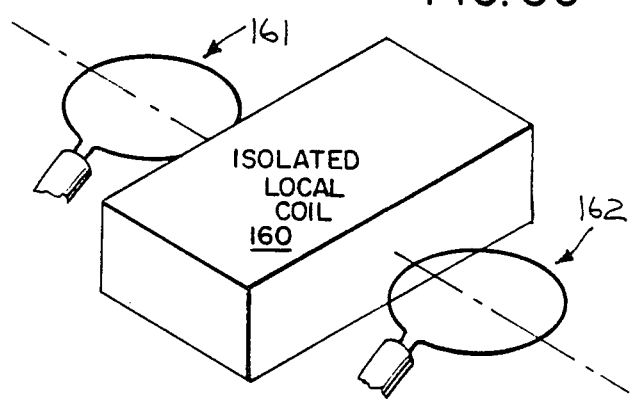
FIG. 5C
FIG. 5D
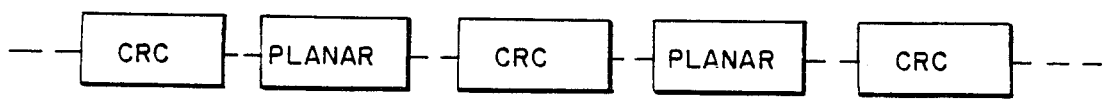

NMR DETECTOR NETWORK

The U.S. Government has a paid-up license in this invention and the right in limited circumstances to require the patent owner to license other on reasonable terms as provided for by the terms of Grant Nos. CA 41664 AND RR01008 awarded by the National Institute of Health.

CROSS-REFERENCE

This application is a continuation-in-part of U.S. patent application Ser. No. 897,177 filed Aug. 15, 1986, now U.S. Pat. No. 4,721,913 which is a continuation-in-part of U.S. patent application Ser. No. 731,923 filed on May 8, 1985 now U.S. Pat. No. 4,724,389.

BACKGROUND OF THE INVENTION

The field of the invention is gyromagnetic resonance spectroscopy, and particularly, local coils which are used to receive the signals produced by gyromagnetic resonance system.

Gyromagnetic resonance spectroscopy is conducted to study nuclei that have magnetic moments and electrons which are in a paramagnetic state. The former is referred to in the art as Nuclear Magnetic Resonance (NMR), and the latter is referred to as Paramagnetic Resonance (EPR) or Electron Spin Resonance (ESR). There are other forms of gyromagnetic spectroscopy that are practiced less frequently, but are also included in the field of this invention.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant of the nucleus).

When a substance such as human tissue is subjected to a uniform magnetic field (polarizing field $B_z$), the individual magnetic moments of the paramagnetic nuclei in the tissue attempt to align with this field but precess about it in random order at their characteristic Larmor frequency. A net magnetic moment $M_z$ is produced in the direction of the polarizing field, but the randomly oriented components in the perpendicular plane (x-y plane) cancel one another. If, however, the substance, or tissue, is irradiated with a magnetic field (excitation field $B_1$) which is in the x-y plane and which is near the Larmor frequency, the net aligned moment, $M_z$, can be rotated into the x-y plane to produce a net transverse magnetic moment $M_1$ which is rotating in the x-y plane at the Larmor frequency.

The practical value of this gyromagnetic phenomena resides in the radio signal which is emitted after the excitaton signal $B_1$ is terminated. When the excitation signal is removed, an oscillating sine wave referred to as an NMR signal is induced in a receiving coil by the rotating field produced by the transverse magnetic moment $M_1$. The frequency of this signal is the Larmor frequency, and its initial amplitude, $A_o$, is determined by the magnitude of $M_1$.

The NMR systems which implement these techniques are constructed in a variety of sizes. Small, specially designed machines are employed to examine laboratory animals or to examine specific parts of the human body. On the other hand, "whole body" NMR scanners are sufficiently large to receive an entire human body and produce an image of any portion thereof. Whole body scanners may employ an excitation coil for producing the excitation field and a separate receiver coil for receiving the NMR signal. The excitation coil produces a highly uniform, or homogeneous, excitation field throughout the entire area of interest, whereas the receiver coil is placed near the immediate area of interest to receive the NMR signal. The receiver coil is sharply tuned to the Larmor frequency of the nuclei of interest.

Recently, a novel resonator structure referred to in the art as a "loop-gap" resonator has been applied to the field of gyromagnetic resonance spectroscopy. As indicated in the U.S. Pat. Nos. 4,435,680; 4,446,429; 4,480,239 and 4,504,788, the loop-gap resonator may take a wide variety of shapes. In all cases, however, a lumped circuit resonator is formed in which a conductive loop is the inductive element and one or more gaps are formed in this loop to form a capacitive element. While the loop-gap resonator has many desirable characteristics normally associated with lumped circuit resonators, it also has some characteristics normally associated with cavity resonators. Most notable of these is the much higher quality factor, or "Q", of the loop-gap resonator over the traditional lumped circuit resonators. When applied to NMR scanners, this higher Q provides a higher signal-to-noise ratio which translates into higher resolution images and shorter scan times.

To enhance the signal-to-noise ratio (SNR) of the receiver coil, it is common practice to reduce its physical size and place it adjacent the immediate region of interest. Such receiver coils are referred to as "surface coils", or "local coils", because their reception field is limited in size to the local area. For example, in U.S. Pat. No. 4,724,389, local coils specifically designed for producing images of the head and neck regions of a human subject are described. In general, the more nearly the reception field of the local coil matches the field of interest, the better the resulting NMR signal.

SUMMARY OF THE INVENTION

A network of NMR detectors according to this invention comprises first detection means for detecting an NMR signal over a first region of sensitivity. Second detection means are employed for detecting an NMR Signal over a second region of sensitivity. The second detection means has essentially no mutual inductance with respect to the first detection means, and at least a part of the second region of sensitivity overlaps with at least a part of the first region of sensitivity.

An object of this invention is to provide an NMR detection network in which signals from a plurality of NMR detectors are combined to achieve a greater signal-to-noise ratio and therefore improved image quality. This can be accomplished in the present invention provided that the detectors have minimal mutual inductance between them.

In one aspect of the invention, the first detection means includes an excitation coil operated in an excite/receive mode. The excitation coil may comprise, for example, a whole body coil particularly adapted for imaging large regions of a human subject, a head coil particularly adapted for imaging cranial regions of a human subject, an extremity coil particularly adapted for imaging extremities of a human subject, or other type of excitation coil. The second detector means includes an intrinsically isolated local coil.

Another object of this invention is to eliminate mutual inductance between detectors in a network of NMR detectors by utilizing an intrinsically isolated local coil. The intrinsically isolated local coil does not couple to the homogeneous fields produced by the excitation coil. The intrinsically isolated local coil may therefore be combined with the excitation coil to form a network which achieves the objects and advantages of this invention.

An advantage of this invention is that a network comprising an intrinsically isolated local coil and an excitation coil can produce superior images. The greatest improvement in image quality occurs at a depth of penetration where the sensitivities of the local coil and the excitation coil are approximately equal.

The intrinsically isolated local coil may include, for example, a Counter Rotating Current (CRC) pair of loop-gap resonators, or a planar pair of loop-gap resonators.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 5A is a pictorial view of a second embodiment of the invented NMR probe;

FIG. 5B is a pictorial view of a third embodiment of the invented NMR probe;

FIG. 5C is a pictorial view of a fourth embodiment of the invented NMR probe;

FIG. 5D is a schematic diagram of a fifth embodiment of the invented NMR probe;

DESCRIPTION OF THE PREFERRED EMBODIMENT

Figure 1A:
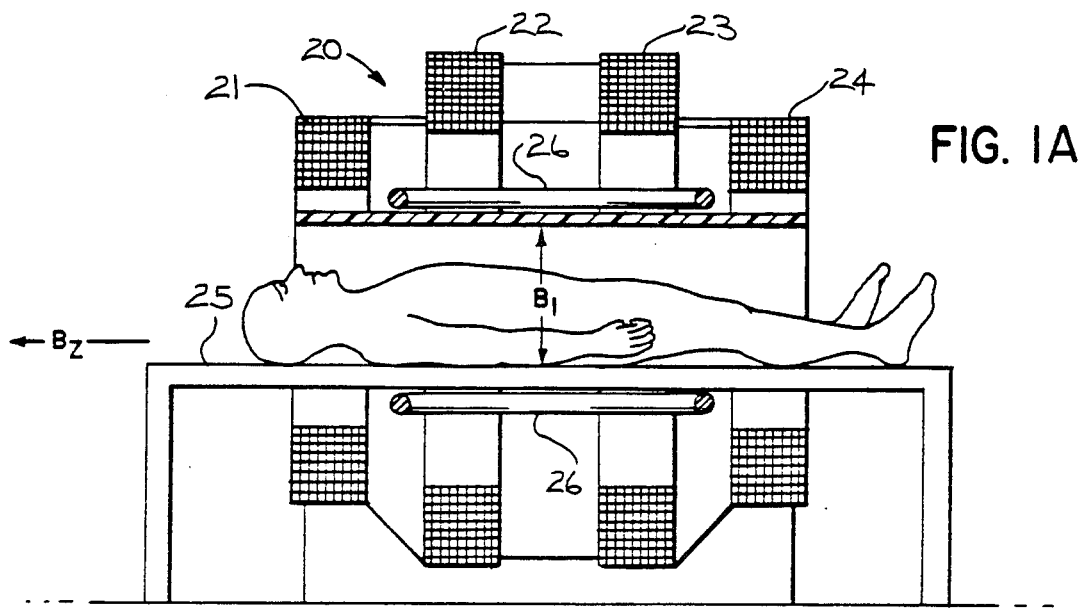
FIG. 1 is a pictorial view of a whole body NMR scanner system which employs the present invention.
FIG. 1B is an electrical block diagram of the NMR scanner system of FIG. 1.

Although the present invention may be easily implemented in a variety of NMR scanner or NMR spectrometer structures, the preferred embodiments of the invention have been employed to detect the NMR signals produced in a large, whole-body NMR scanner. Referring particularly to FIG. 1A, this scanner employs a polarizing magnet 20 which is comprised of four circular cylindrical segments 21-24 of sufficient size to receive a table 25.

A patient may be placed on the table 25 and any portion of his body may be scanned by suitably positioning him with respect to a set of excitation coils 26. The polarizing magnet 20 produces a strong magnetic field $B_z$, which is constant and homogeneous within the space defined by the excitation coils 26 The excitation coils 26 produce an excitation field $B_1$ which is in the transverse plane, perpendicular to the polarizing field $B_z$. The excitation field $B_1$ oscillates at a radio frequency $\omega_0 = 63.89$ MHz, and it is applied as one or more pulses during each measurement cycle. There are also three sets of gradient coils 27-29 (not shown in FIG. 1A) which produce magnetic field gradients in the region between the excitation coils 26.

Figure 1B:
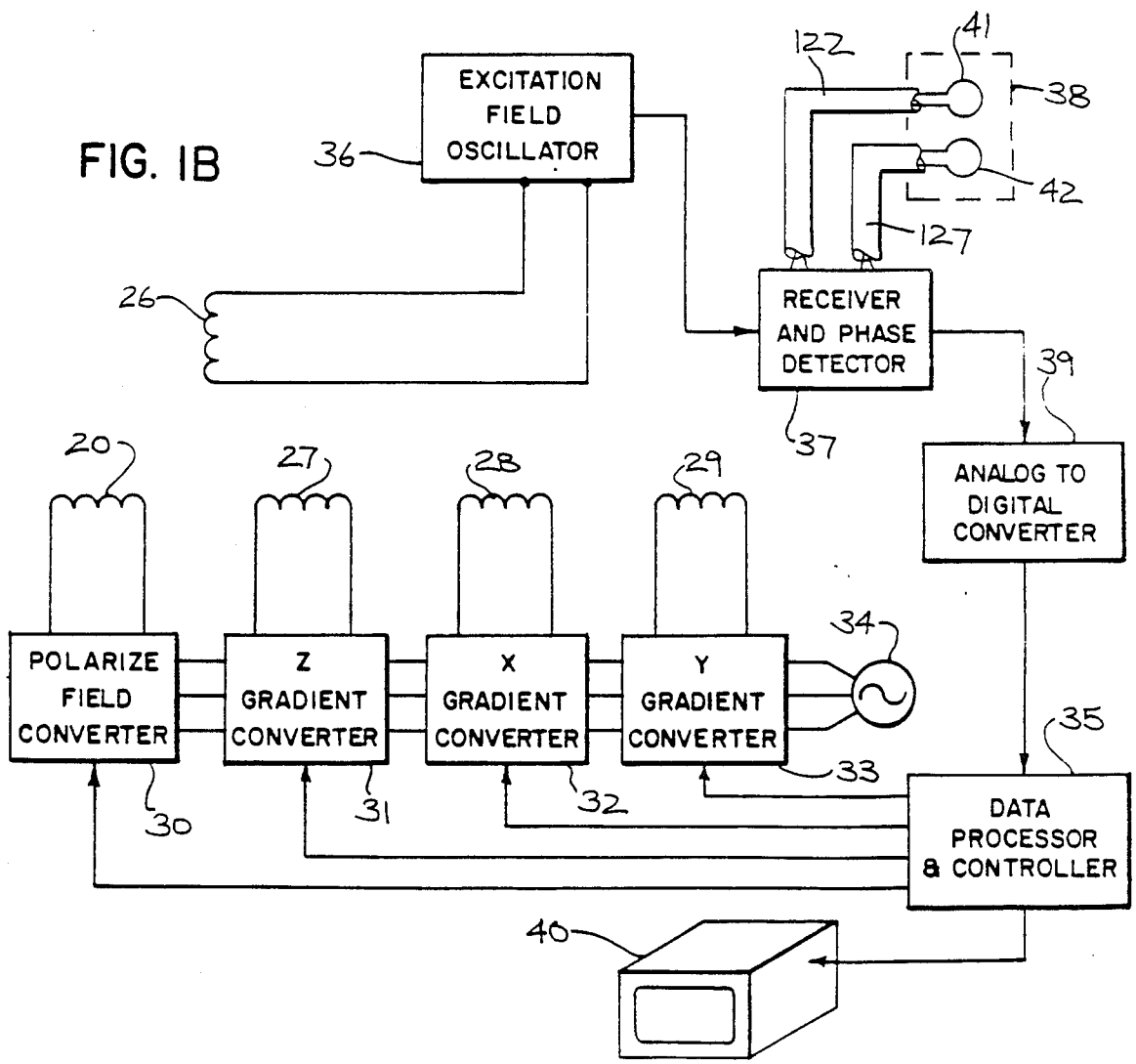

Referring particularly to FIG. 1B, the control system for the NMR scanner includes a set of four static power converters 30-33 which connect to an a.c. power source 34. The static converters 30-33 produce d.c. currents for the respective coils 20 and 27-29 at levels determined by commands received from a processor 35. Both the magnitude and the direction of the gradient fields in the x, y and z directions are controlled by the processor 35 to "scan" a region between the excitation coils 26 and to thereby collect spatially encoded NMR data which can be reconstructed into an image.

The processor 35 also controls the operation of an excitation field oscillator 36 which is connected to the excitation coils 26 and which is turned on and off during each measurement cycle of the scanning process. The oscillator 36 also provides a reference signal to a receiver and phase detector circuit 37, which in turn is connected to receive the NMR signals from a local NMR probe 38. The NMR signals are amplified and detected by the circuit 37 and are then applied to the input of an analog-to-digital converter 39. The digitized NMR signals are processed using well-known NMR imaging techniques, and image data is produce by the processor for display on a CRT 40.

The present invention concerns the construction of the local NMR probe 38, and as suggested in FIG. 1B, this probe includes a plurality of local coils which are indicated at 41 and 42. Each coil 31 and 42 produces a separate NMR signal which is processed by the receiver/detector 37, analog-to-digital converter 39 and the data processor 35. This processing can be performed by providing separate channels for each NMR signal, or the separate NMR signals may be multiplexed through a single channel. By providing separate channels, the signals are processed in parallel and combined in the data processor 35 to produce the desired image. While separate NMR signals may be combined and applied to a single channel, it has been found that best results are achieved if at least a separate pre-amplifier is provided for each NMR local coil in the probe 38.

Figure 2:
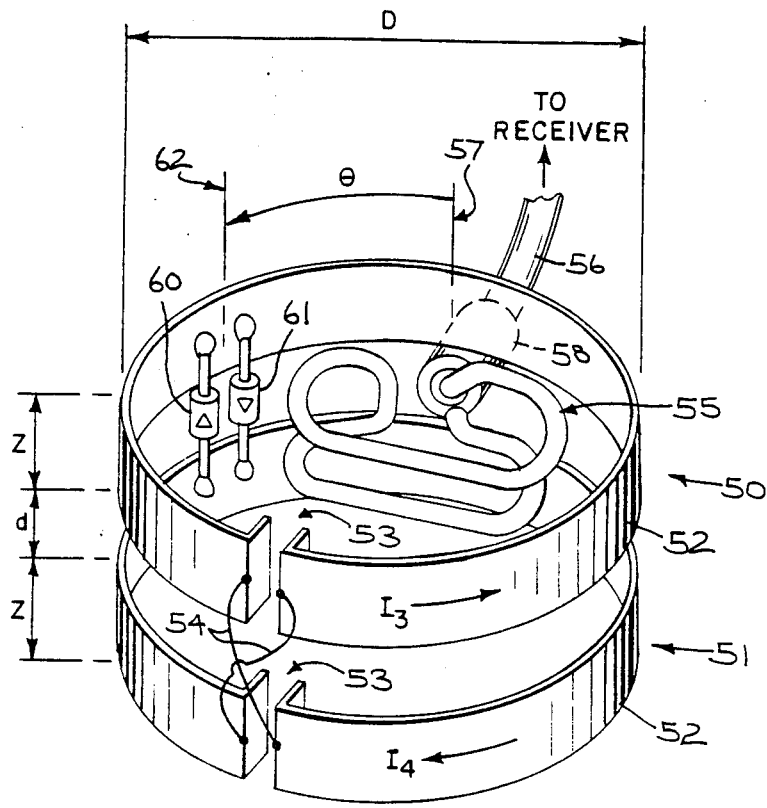
FIG. 2 is a perspective view of a local coil which may be employed as part of the present invention and which is referred to as a CRC pair.
Figure 3:
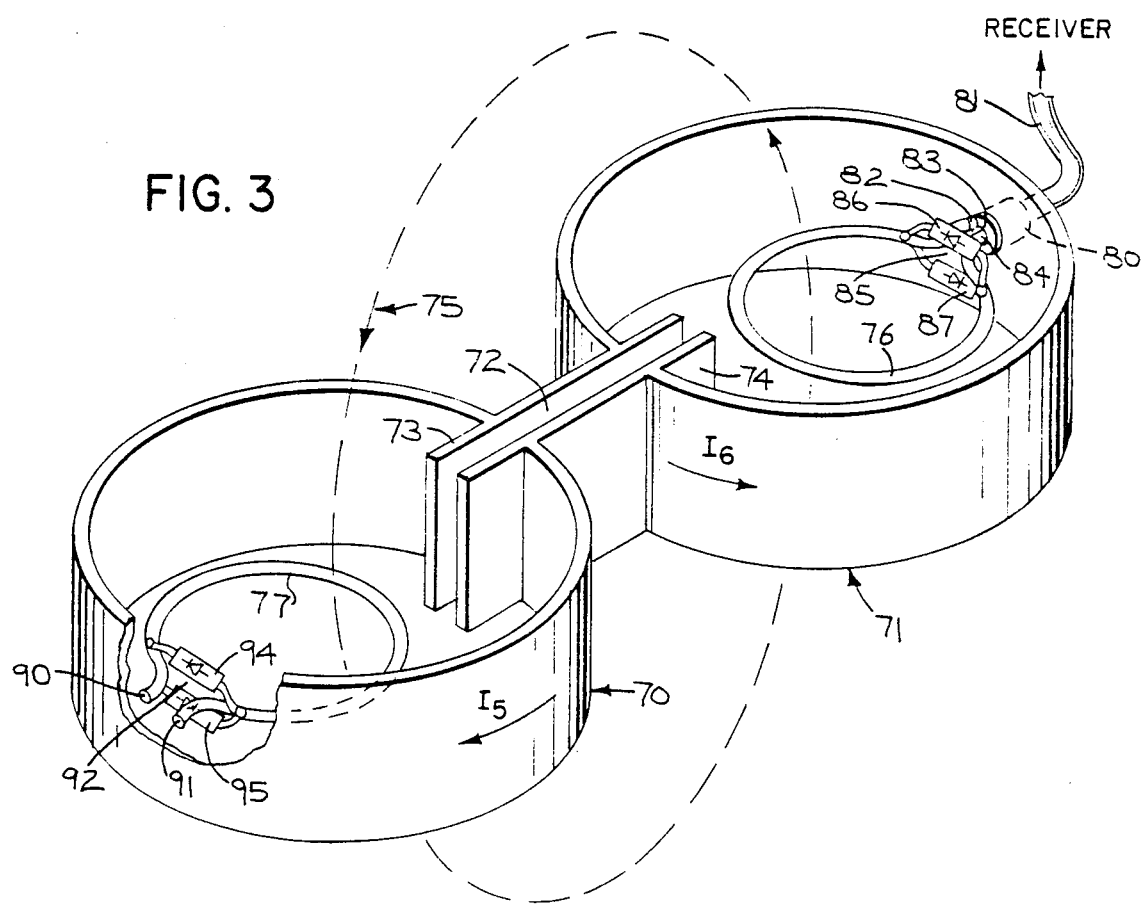
FIG. 3 is a perspective view of another local coil which may be employed as part of the present invention and which is referred to as a planar pair.

The NMR probes described herein employ local NMR coils which have some very unique characteristics. Two such structures are shown in FIGS. 2 and 3 and will now be described briefly. For a more complete description of the construction and theory of operation of these local NMR coils, reference is made to co-pending U.S. patent application Ser. No. 731,923 filed on May 8, 1985, now U.S. Pat. No. 4,724,389 entitled "Loop-Gap Resonator for Localized NMR Imaging" and co-pending U.S. patent application Ser. No. 897,165 filed on Aug. 15, 1986, now U.S. Pat. No. 4,725,779 entitled "NMR Local Coil With Improved Decoupling", both of which are herein incorporated by reference.

Referring to FIG. 2, one type of NMR local coil suitable for use in the present invention includes a pair of loop-gap resonators 50 and 51. Each resonator 50 and 51 is comprised of a loop of conductive material 52 which serves as an inductive element and a gap 53 formed by parallel plates of conductive material which serves as a capacitive element. Details of loop-gap resonator geometry are generally known in the art and also described in U.S. Pat. No. 4,446,429 to the assignee of the present invention, the contents of which are herein incorporated by reference.

The two loop-gap resonators 50 and 51 are aligned axially and separated by a distance d. The resulting local coil is characterized by Counter Rotating Current (CRC), namely $I_3$ and $I_4$, in the loops 52 of the respective loop-gap resonators. Such a configuration is designated herein as a CRC pair. The widths of the conductive loops 52 is Z and the diameter of the loops 52 is D. The values D, d, and Z can vary significantly to produce local coils of different diameters, D, ranging from about 5 cm. to about 15 cm. by changing d and Z proportionately.

The conductive loops 52 are formed on the inside surface of a section of polyvinylchloride (PVC) tubing (not shown) having an appropriate inside diameter using adhesive backed copper foil type no. 1151 manufactured by 3M company. The gaps 53 are formed from double-sided printed circuit board material, which is commercially available. The printed circuit board material is bonded edgewise on the inside of the PVC tubing to form the capacitive element of each loop-gap resonator 50 and 51. The copper foil on each side of the circuit board serves as a plate of the capacitive element and is bonded to one end of the respective conductive loops 52. The printed circuit board material is trimmed in size to tune the CRC mode of the local coil to the resonant frequency of the gyromagnetic material of interest (near 64 MHz in the scanner of FIG. 1A). To force the resonators 50 and 51 into the CRC mode as described above, a pair of crossed wires 54 are used to connect opposite plates of the capacitive elements of the resonators 50 and 51.

A coupling structure 55 is employed to couple to NMR signal from the loop-gap resonators 50 and 51 to a transmission line 56. The coupling structure 55 is formed from a folded loop of solid copper wire. The folded loop structure consists of an upper portion and a lower portion which are parallel to each other. Like the CRC pair, the folded loop structure itself possesses the property of intrinsic isolation. A uniform field of arbitrary polarization does not interact with the coupling structure 55. The currents in the upper and lower portions of the coupling structure 55 are opposite in direction, thus permitting coupling to the CRC mode of the resonators 50 and 51 when the coupler lies midway between the loops 52. Other types of coupling structures may also be used with this invention. For example, the NMR signal may be taken directly from one of the gaps 53 by connecting a pair of lead wires.

The coupling structure 55 is mounted between the loops 52 at a position indicated by dashed line 57 which is directly across from the gaps 53. Because it lies midway between the plates of the capacitor, the line 57 represents the position of zero voltage between the loops 52. By mounting the coupling structure 55 at the zero potential line 57, voltage insulation problems are reduced. The coupling structure 55 is bonded to a standard BNC connector 58, well known in the art for connection through the transmission line 56 to a receiver (not shown). The receiver amplifies, detects, and processes the NMR signals in well known fashion.

A pair of diodes 60 and 61 are connected across the loops 52 to provide passive decoupling during excitation. The diodes 60 and 61 are of the fast recovery type, suitable for use at VHF frequencies. The diodes 60 and 61 are connected back-to-back with the cathode of diode 60 and the anode of diode 61 being connected to resonator 50, while the anode of diode 60 and the cathode of diode 61 are connected to resonator 51. The diodes 60 and 61 are connected to the loops 52 next to each other at a position indicated by dashed line 62. The angle $\theta$ between the respective axes 57 and 62 is chosen such that the voltage between the loops 52 at this point causes the diodes 60 and 61 to conduct and thereby de-tune the NMR coil when large, nonhomogeneous electromagnetic fields are applied. In the preferred embodiment shown, the angle $\theta$ is forty-five degrees.

The CRC NMR coil of FIG. 2 is said to be "intrinsically isolated" in that a signal will not be produced in the cable 56 as a result of a homogeneous magnetic field which passes through both loop-gap resonators 50 and 51. However, a magnetic field produced by gyromagnetic material located near the top or bottom of the CRC NMR coil is not homogeneous, and it will produce an NMR signal in the cable 56. Reference is made to the above cited U.S. Pat. No. 4,724,389, for a more detailed explanation of the operation of the CRC NMR coil of FIG. 2.

Another intrinsically isolated NMR coil is shown in FIG. 3. This coil is also described in great detail in the above cited co-pending U.S. patent application, and it is referred to therein as a "planar pair". The planar pair includes two loop-gap resonators 70 and 71 arranged side-by-side in what is termed herein as a planar pair configuration. A gap 72 common to both resonators 70 and 71 is formed by plates 73 and 74 which function as the capacitive elements and also connect the resonators 70 and 71 together. The planar pair is constructed in a manner similar to that described above for the CRC pair, using adhesive-backed copper foil inside PVC tubing for the loops and double-sided printed circuit board material for the capacitive elements.

The loop-gap resonators 70 and 71 may be constructed with a wide variety of dimensions with the main diameter of each loop-gap resonator 70 and 71 typically from 5 to 15 cm. Because the plates 73 and 74 are common to both resonators, the currents $I_5$ and $I_6$ are forced to be in opposite directions. As a result, the paths for magnetic flux through the resonators 70 and 71 as indicated by dashed line 75 is also in opposite directions through the resonators 70 and 71. Therefore, the planar pair also possesses the property of intrinsic isolation as it does not couple to a uniform magnetic field.

Still referring to FIG. 3, passive decoupling for the planar pair is accomplished using conductive loops 76 and 77 in the interior of each resonator 70 and 71. Each conductive loop is approximately one-half of the main diameter of the loop-gap resonators 70 and 71. One of the conductive loops 76 functions as a pick-up loop to couple the received NMR signal through a coaxial connector 80 to a coaxial cable 81. The other end of the coaxial cable 81 connects to a receiver (not shown), where the NMR signal is detected and processed in well known fashion.

One end 82 of the pick-up loop 76 is attached onto the outer rim 83 of the coaxial connector 80, while the other end of the pick-up loop 76 is attached to the center terminal (not shown) of the coaxial connector 80. The connection of the two ends 82 and 84 of the pick-up loop 76 to the coaxial connector 80 provides both physical support for the pick-up loop 76 and electrical isolation for the two ends 82 and 84. Thus, the pick-up loop contains an open segment shown generally at 85 across the ends 82 and 84. A pair of back-to-back diodes 86 and 87 are connected across the open segment 85.

In order to maintain the integrity of the intrinsic isolation in the planar pair, it is critical to maintain symmetry between the loop-gap resonators 70 and 71. The second conductive loop 77 is used for this purpose, acting only as a dummy loop to provide symmetry for the pick-up loop 76. The dummy loop 77 has two ends 90 and 91, which are anchored into the PVC tubing which forms an insulating wall of loop-gap resonator 70, and are insulated from the copper foil on the inside of the insulating wall. The dummy loop 77 therefore contains an open segment shown generally at 92 across the ends 90 and 91. Another pair of back-to-back diodes 94 and 95 are connected across the open segment 92. The diodes 86–87 and 94–95 are also fast recovery type suitable for use at VHF frequencies.

During excitation, nonuniform components of the excitation field cause the voltage across the open segments 85 and 92 to rise until the threshold voltage of the back-to-back diodes 86–87 and 94–95 is reached. Then the diodes 86–87 and 94–95 begin conducting, thereby effectively changing the pickup loop 76 and the dummy loop 77 into shorted turns. This results in a sharp lowering of the Q and shifting of the resonant frequency of the planar pair, thereby decoupling it from the excitation field. After the excitation field is removed to receive the NMR signals, the diodes 86–87 and 94–95 revert to their nonconducting state and are effectively out of the circuit. The NMR signal is then coupled by the pick-up loop 76 into the coaxial cable 81.

Figure 4A:
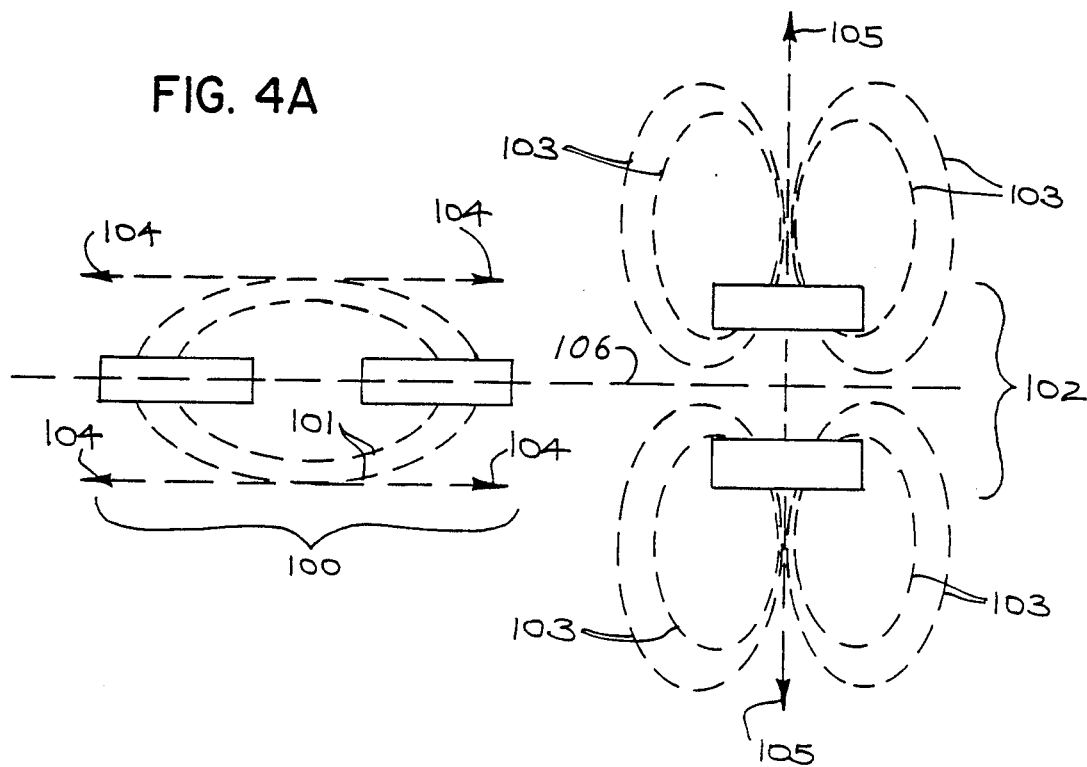
FIG. 4A is a schematic representation of the vector reception fields of a CRC pair and a planar pair.

An important discovery of this invention is that while both the CRC pair and the planar pair are sensitive to NMR signals which are produced in a region of interest adjacent to their face, their sensitivities are substantially orthogonal. This is illustrated in FIG. 4A, where a planar pair 100 and a CRC pair 102 are shown positioned on a common plane indicated by dashed line 106. The "vector reception field" of the planar pair 100 is illustrated by dashed lines 101, and the vector reception field of the CRC pair 102 is illustrated by dashed lines 103.

In the region of interest of the planar pair 100, the vector reception field has a direction indicated by arrows 104, and in the region of interest of the CRC pair 102, the vector reception field has a direction indicated by the arrows 105. When oriented as shown, therefore, the respective NMR coils 100 and 102 are sensitive to orthogonal components of a magnetic field produced by NMR excitation.

There are two benefits which flow from the orthogonal nature of these vector reception fields. First, the two coils can be combined into a network to form a single NMR probe, designated herein a quadrature probe, which is sensitive to both orthogonal components of an NMR signal. This provides an improvement in the signal-to-noise ratio by a factor of $\sqrt{2}$ for the quadrature probe as compared to a single local coil.

Secondly, the mutual inductance between the planar pair and CRC coil is minimal when they are aligned with a common plane of symmetry. This enables networks of NMR local coils to be constructed to substantially increase the field of view without losing the signal-to-noise advantages characteristic of local coils.

The first of these benefits will now be described with respect to the first preferred embodiment of the invention shown in FIGS. 4B and 4C, and the second benefit will then be described with respect to a number of embodiments shown in FIGS. 5A–5D.

Figure 4D:
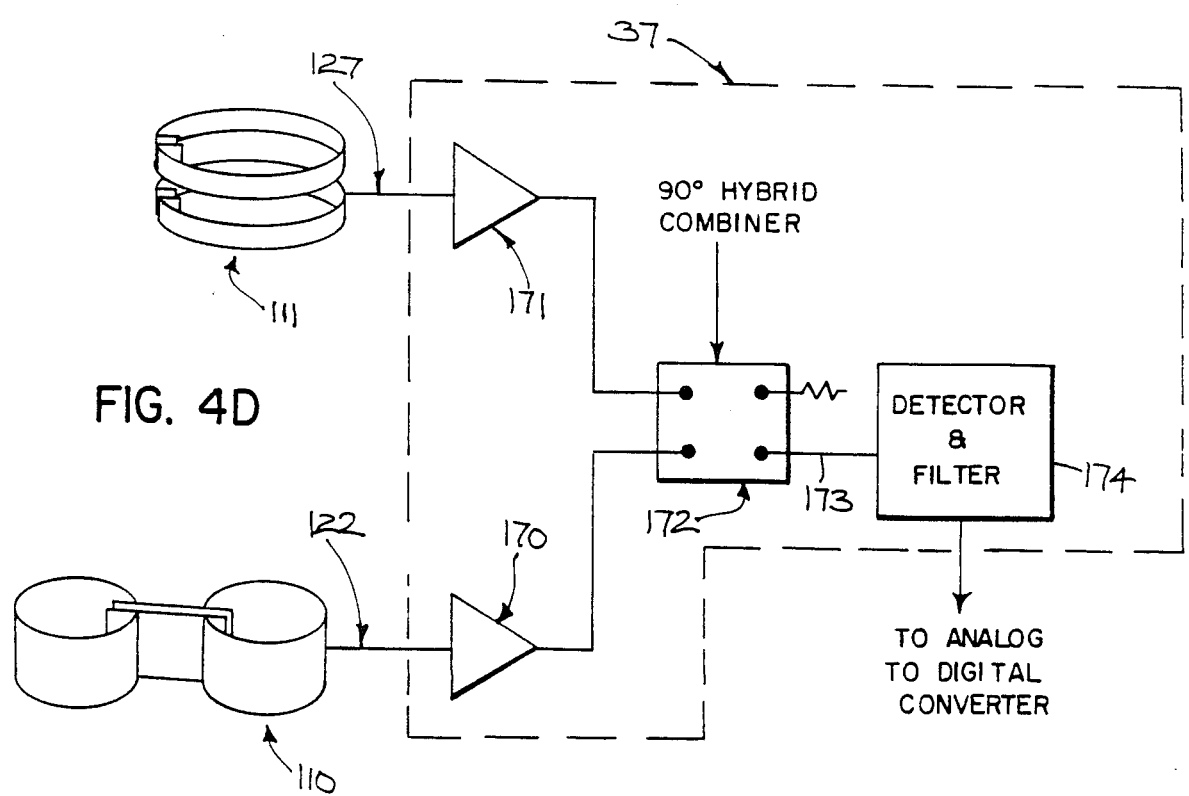
FIG. 4D is a schematic diagram of the receiver and phase detector which forms a part of the scanner system of FIG. 1B connected to the quadrature probe of FIGS. 4B and 4C.
Figure 4B:
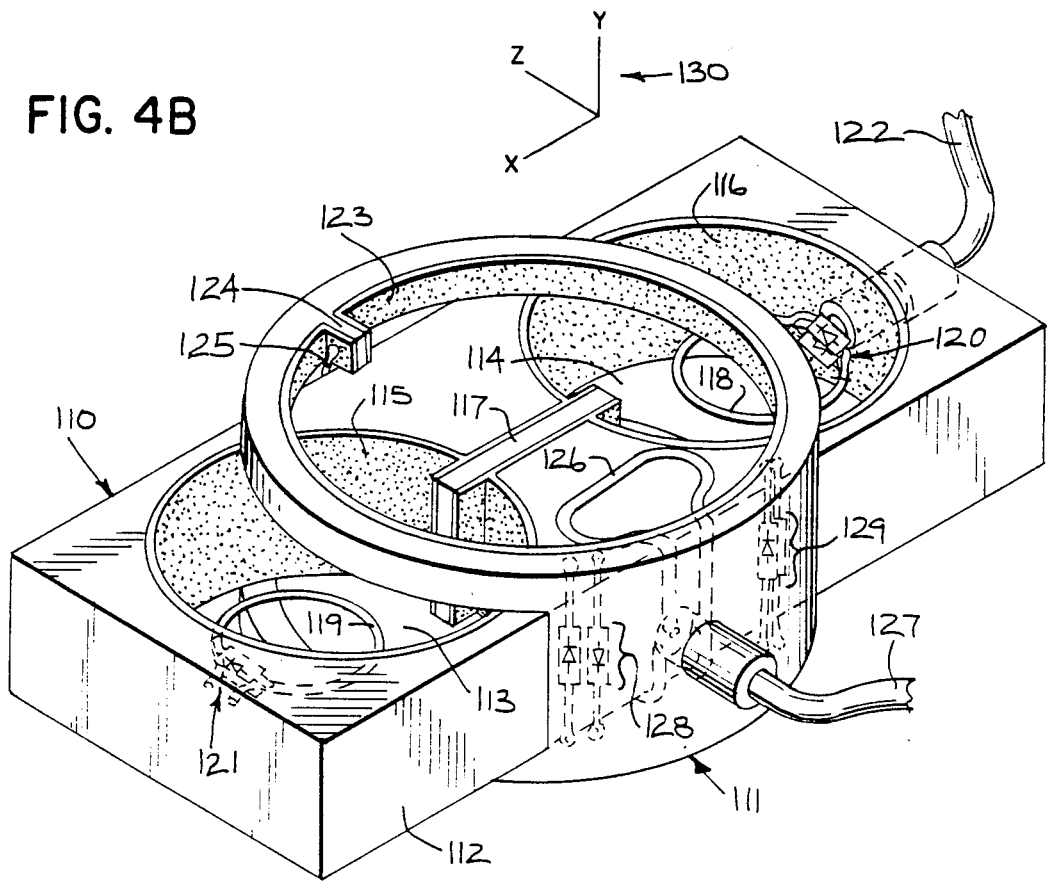
FIG. 4B is a perspective view of a first preferred embodiment of the invention which is referred to herein as a quadrature probe.
Figure 4C:
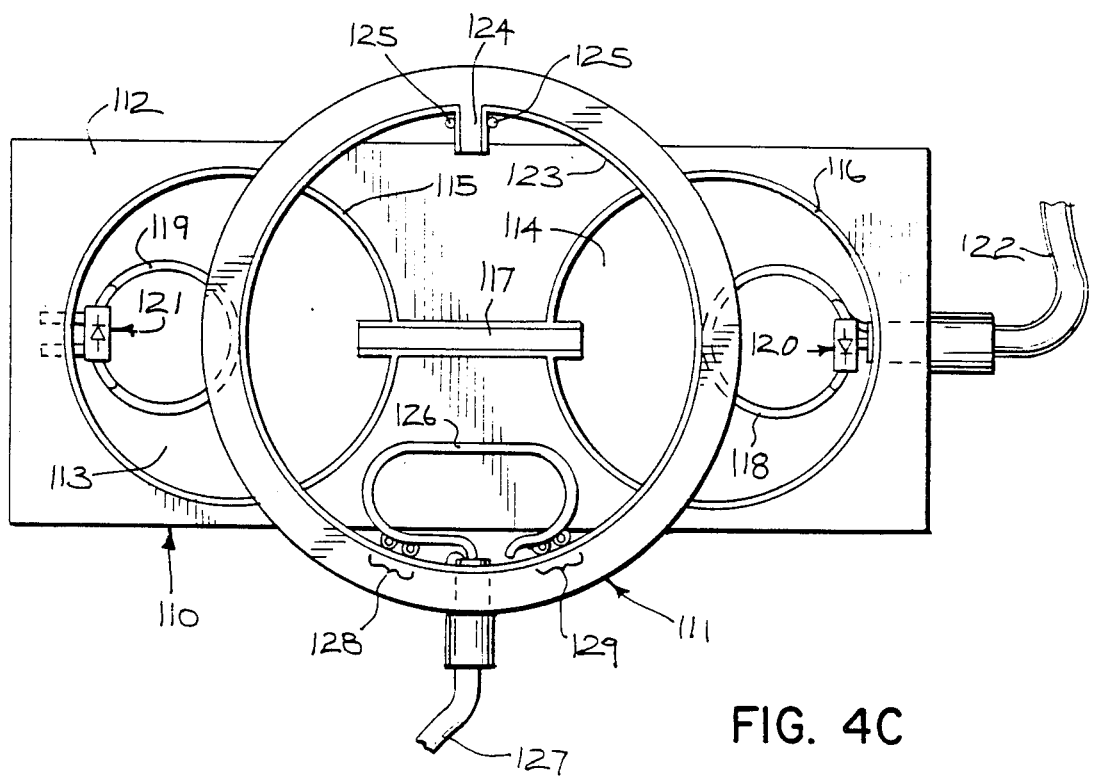
FIG. 4C is a top elevation view of the quadrature probe.

Referring particularly to FIGS. 4B and 4C, an NMR probe includes a planar pair local coil 110 sandwiched between the loops of a CRC pair local coil 111. The planar probe local coil 110 is formed from a block 112 of polymethylmethacrylate material, which is commercially available. Two cylindrical cut-outs 113 and 114 in the block 112 define the loops of the planar pair. The actual loops 115 and 116 are formed by adhesive-backed copper foil on the inside of each cylindrical cut-out 113 and 114 respectively.

A channel is also cut into the block 112 connecting the two cylindrical cut-outs 113 and 114 which defines the common gap for the planar pair 110. The actual gap is formed by a piece of double-sided microwave type printed circuit board material 117 inserted in the channel. The printed circuit board material 117 also serves to connect the gaps of the two loops 115 and 116 in parallel.

The resonant frequency of the planar pair 110 may be adjusted by trimming the ends of the printed circuit board 117 or by adding a trimming capacitor (not shown) across the common gap. A pick-up loop 118 and dummy loop 119 with back-to-back diode pairs 120 and 121 respectively are used to provide passive decoupling as described above. A cable 122 couples the signal from the pick-up loop 118 to the preamplifier.

Still referring to FIGS. 4B and 4C, the CRC pair 111 is formed from a piece of PVC tubing in which the area between the loops of the CRC pair is cut away to allow the planar pair 110 to be disposed there. Otherwise, the construction of the CRC pair 112 is similar to that described above in relation to FIG. 2. Adhesive-backed copper foil is used to form the loops 123 and a piece of microwave type printed circuit board material 124 is used for each of the gaps.

Although only the upper loop is visible in FIGS. 4B and 4C, the lower loop is identical. A pair of crossed wires 125 connect opposite plates of the upper and lower gap together. A folded loop coupling structure 126 is used to couple the NMR signal from the loops 123 to a cable 127 for connection to a preamplifier. The folded loops of the coupling structure 126 are extended above and below the block 112 to provide the necessary clearance. Two pairs of back-to-back diodes 128 and 129 are used to provide passive decoupling as described above. The diode pairs 128 and 129 are each positioned 20 degrees on either side of the coupling structure 126.

In the quadrature probe of FIGS. 4B and 4C, the approximate dimensions are as follows. The loops 123 of the CRC pair are 7.5 cm. in diameter and 0.6 cm. in width. The block 112 which forms the planar pair 110 is 1.9 cm. thick by 10 cm. wide by 17 cm. long. These dimensions are used for simplicity of construction and are not critical to the function of the quadrature probe. A wide range of dimensions for the quadrature probe, and relative dimensions for the local coils within the quadrature probe are possible, provided that the local coils are arranged to maintain symmetry and thereby minimize mutual inductance.

Referring to FIGS. 1B and 4D, in order to combine the signals from the quadrature probe of FIGS. 4B and 4C, the receiver and phase detector 37 includes separate preamplifiers 170 and 171 for inputs from the planar pair 110 and CRC pair 111 through the cables 122 and 127 respectively. Since these signals are orthogonal, they may be combined in a 90 degree hybrid combiner 172. The hybrid combiner 172 used in this embodiment is a type QHC-3-60 manufactured by Merrimac of West Caldwell, N.J. The output 173 of the hybrid combiner 172 is then processed by the customary single channel detector and filter 174, and then output to the Analog to Digital (A/D) converter 39. As an alternative to combining the two signals from the preamplifiers 170 and 171, the signals could be processed in parallel by a second detector, filter, and A/D converter (not shown) and then combined in the processor 35.

Referring again to FIG. 4B, a coordinate system 130 indicates reference directions for the discussion below. In the quadrature probe described above, the geometric centers of the planar pair and CRC pair coincide. It is an important teaching of this invention that local coils, which are isolated from each other by virtue of orthogonal vector reception fields, may also be displaced from one another and still maintain their isolation.

Fields arising from currents in either loop 115 and 116 of the planar pair 110 couple to both loops 123 of the CRC pair 111 which generates emf's in the loops 123 which are canceled by the crossed wires 125 across the gaps. This type of cancellation is termed herein as "emf cancellation". A second type of cancellation, termed herein as "field cancellation", occurs between the fields arising from currents in loops 115 and 116 of the planar pair 110 are equal and opposite as they pass through either loop 123 of the CRC pair 111 and the fields therefore cancel.

If the CRC pair 111 is translated in the x-z plane, emf cancellation is still effective and isolation between the local coils is preserved. If the CRC pair 111 is translated along the z axis, both emf and field cancellation remain in effect and the local coils remain isolated. Finally, the CRC pair 111 may be both translated in the y-z plane and rotated about the x axis with field cancellation still in effect providing isolation for the local coils.

Since the local coils can be displaced from one another and still remain isolated, it is possible with the present invention to form a network of local coils. The quadrature probe described above is one example of such a network in which the regions of sensitivity of the two coils coincide, resulting in an increase in the signal-to-noise ratio. If the local coils are displaced from one another, the net region of sensitivity is expanded so that a larger area can be examined in a given time, but without the same increase in signal-to-noise ratio.

Referring to FIG. 5A, a second embodiment of the invention includes a network of local coils aligned on an axis 0 comprising a planar pair 141 flanked on either side by CRC pairs 142 and 143 In this embodiment, the planar pair 141 and either CRC pair 142 or 143 are isolated from each other as described above. In other words, each CRC pair 142 and 143 considered separately is isolated from the planar pair. In addition, the CRC pairs 142 and 143 are isolated from each other because they are separated enough so that their respective regions of sensitivity do not overlap.

Figure 6:
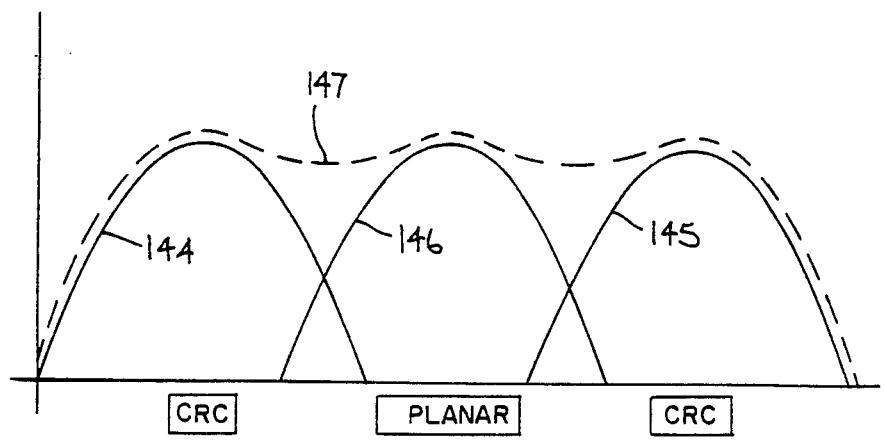
FIG. 6 is a graphic representation of the reception field of the NMR probe of FIG. 5A.

Referring to FIG. 6, the regions of sensitivity 144 and 145 for the CRC pairs 142 and 143 respectively do not overlap with each other, but both regions of sensitivity of the CRC pairs 142 and 143 overlap a portion of the region of sensitivity 146 of the planar pair 141. Hence, there exists a net region of sensitivity, indicated generally by dashed line 147 which spans all three local coils.

This expanded region of sensitivity may be utilized in several ways. The three separate signals may be sampled separately on successive examination cycles. While this technique takes more time, it can be implemented simply on existing systems without extensive modification, while still saving patient set-up time. On the other hand, since the signals from the three local coils are isolated, all three signals could be sampled during a single examination cycle and then either stored for subsequent processing or processed in parallel.

Referring to FIG. 5B, a third embodiment of the invention includes a network of local coils comprising a CRC pair 150 flanked on either side by planar pairs 151 and 152. Like the network of local coils described above in relation to FIG. 5A, either planar pair 151 or 152 are isolated from each other by their physical separation. Therefore, this network also provides a net region of sensitivity which spans all three local coils similar to the second embodiment described above.

It is a further teaching of this invention that it is sufficient for a single local coil to provide isolation to adjacent local coils in the network. Referring to FIG. 5C, a fourth embodiment of the invention includes an isolated local coil indicated by block 160, flanked on both sides by single turn loop type local coils 161 and 162 as are commonly used in the art. The isolated local coil 160 may be a CRC pair, planar pair, butterfly pair, or other isolated geometry. In the case that the isolated local coil 160 is a CRC pair, isolation from the single turn local coil is achieved by emf cancellation. If the isolated local coil 160 is a planar pair or butterfly pair, then isolation is provided by field cancellation.

Referring to FIG. 5D, the second and third embodiments described above can be combined to form a fifth embodiment of the invention in which a network of local coils arranged in an alternating pattern of planar pair and CRC pair local coils. In this embodiment, sequential local coils lie in the y-z plane and are angled slightly about their x axis as described above in relation to FIG. 4B. This arrangement is particularly useful for examining a long, curved surface of a human patient such as, for example, the spine.

Figure 7:
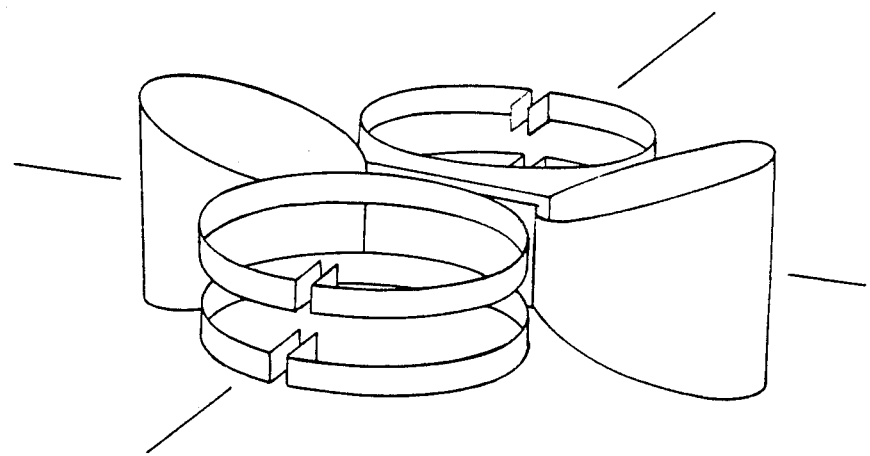
FIG. 7 is a pictorial view of the embodiment of FIG. 5A using a butterfly pair local coil.

There are many types of local coil geometries which can be isolated according to the present invention. For example, a butterfly pair is described in U.S. patent application Ser. No. 731,923 filed on May 8, 1985 by the assignee of the present invention, now U.S. Pat. No. 4,724,389, the contents of which are herein incorporated by reference. The butterfly pair has construction and properties similar to the planar pair and may be used interchangeably with the planar pair in the second and third embodiments described above. FIG. 7 illustrates a butterfly pair being used the second embodiment.

Figure 8:
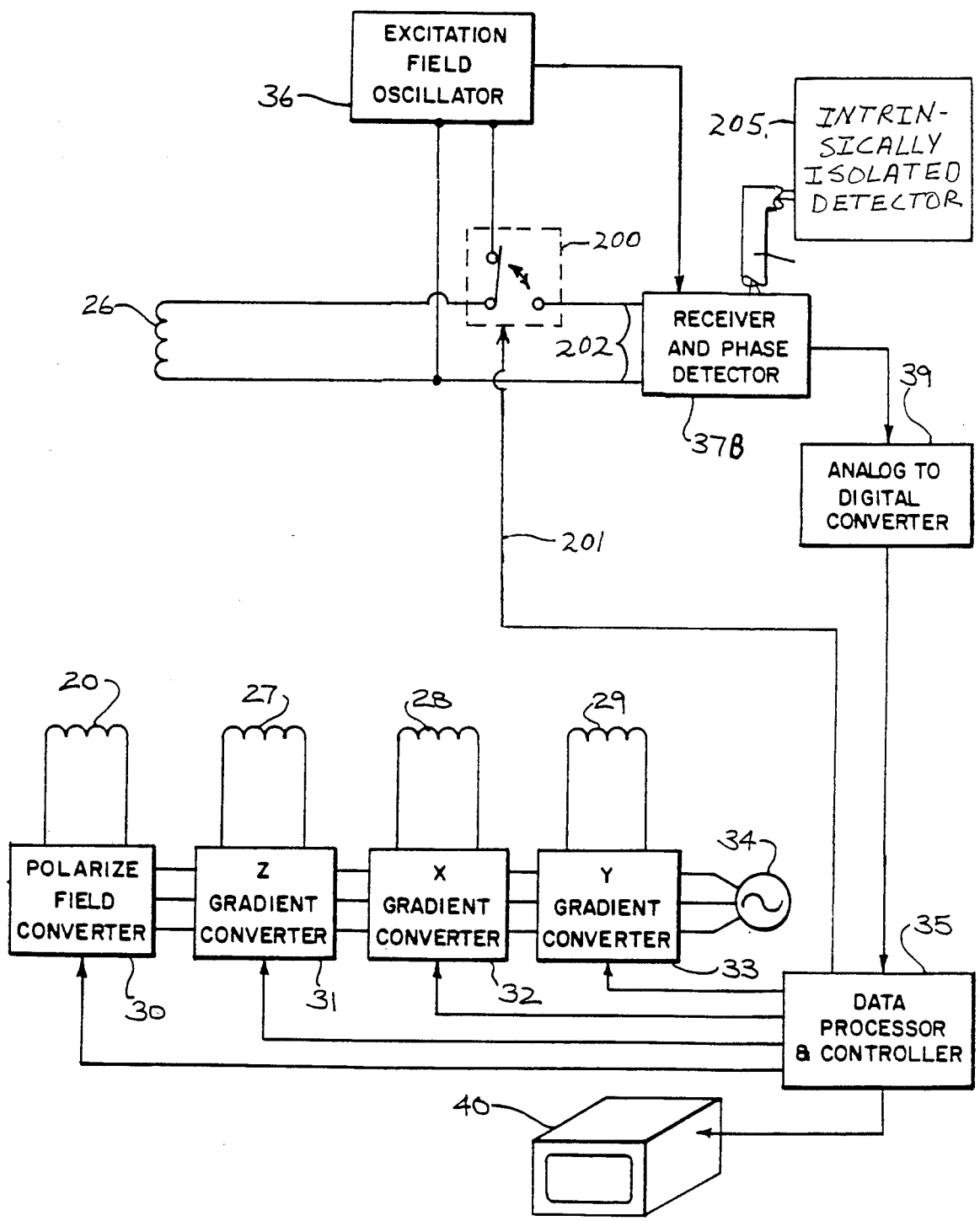
FIG. 8 is a sixth embodiment of an NMR detector network of this invention.

Referring to FIG. 8, in yet a further embodiment of the invention, a network for detection of NMR signals includes the excitation coil 26 operated in an excite/receive mode. In the excite/receive mode, a switch 200 is provided to switch the excitation coil 26 between the excitation field oscillator 36 and a receiver and phase detector 37B. With switch 200 in the excitation position, an excitation signal is applied to the excitation coil 26 by the excitation field oscillator 36, with the receiver and phase detector 37B physically isolated. Upon termination of the excitation pulse, switch 200 is thrown to connect the excitation coil 26 to the receiver and phase detector 37B to detect the FID signal. Control of the switch 200 is provided by the data processor and control unit 35 over control line 201.

It should be understood in the discussions that follow that the excitation coil 26 may be any type of coil operated in the excite/receive mode. Some typical examples for the excitation coil 26 which are commonly known and used in the art include whole body coils, head coils, extremity coils, and other coils adapted for imaging specific specimens of interest.

During the receive cycle when operating in the excite/receive mode, the signal from the excitation coil 26 is coupled to the receiver and phase detector 37B over lines 202. The receiver and phase detector 37B operates in a manner similar to that described for the receiver and phase detector 37 described in relation to FIG. 4D, except that one of the input signals is from the excite/receive coil 26.

The sensitivity of the excitation coil 26 operated in the excite/receive mode is low near the surface and increases with increasing depth of penetration. Conversely, local coils, or surface coils, have a high sensitivity near the surface which decreases with increasing depth of penetration. Therefore, local coils are preferred for imaging areas near the surface of a subject because of their greater sensitivity in shallow regions. Alternatively, the excitation coil 26 is commonly used in the excite/receive mode for imaging areas deep inside a subject because of its greater sensitivity in deeper regions.

An important discovery of this invention is that many areas of interest, particularly in imaging human subjects, exist at depths of penetration where the sensitivities from surface coils and excitation coils operated in the excite/receive mode are approximately equal, e.g. a "crossover" point. For imaging such areas, this invention provides a network for combining the signals from both the surface coil and the excitation coil. The result is an improved signal-to-noise ratio over that which could be accomplished with either coil alone, with the greatest improvement occurring in the vicinity of the crossover point.

The approximate depth of penetration where the crossover point occurs is dependent upon the region being imaged, the type of excitation coil being used, and other factors. For example, the crossover point of sensitivity between a head coil and a surface coil imaging the same area occurs at a depth of penetration of approximately 6 centimeters (cm). For a whole body coil, crossover occurs at approximately 8 to 10 cm depth of penetration.

In the embodiment of FIG. 8, the excitation coil 26 is combined with an intrinsically isolated local coil 205 to form the desired detection network. The intrinsically isolated local coil 205 may be any of the types described above, i.e. CRC pair, planar pair, butterfly pair, or other intrinsically isolated geometry. Because the local coil 205 is intrinsically isolated, there is no mutual inductance between the local coil 205 and the excitation coil 206.

The respective outputs from these two detectors 26 and 205 can therefore be combined in the receiver and phase detector 37B to achieve the same improvement in signal-to-noise ratio as described above. This provides better imaging than has been possible with either coil alone, especially in areas near the crossover point.

It should be apparent to one skilled in the art that the intrinsically isolated detector 205 may itself comprise a network of local coils as described above. In that event, the combining of the signals from the individual coils in the network which forms the detector 205 and the excitation coil 26 can be performed utilizing separate receiver channels and parallel processing as described above.

We claim:

1. A network of NMR detectors comprising:
   first detection means for detecting an NMR signal, the first detection means including an excitation coil operated in an excite/receive mode, the first detection means having a first region of sensitivity; and
   second detection means having a second region of sensitivity, the second detection means having essentially no mutual inductance with respect to the first detection means, and in which at least a part of the second region of sensitivity overlaps with at least a part of the first region of sensitivity.

2. The network of claim 1 in which the excitation coil is a whole body coil particularly adapted for imaging large regions of a human subject.

3. The network of claim 1 in which the excitation coil is a head coil particularly adapted for imaging cranial regions of a human subject.

4. The network of claim 1 in which the excitation coil is an extremity coil particularly adapted for imaging extremities of a human subject.

5. The network of claim 1 in which the second detector means includes an intrinsically isolated local coil.

6. The network of claim 5 in which the intrinsically isolated local coil is a Counter Rotating Current (CRC) pair of loop-gap resonators.

7. The network of claim 5 in which the intrinsically isolated local coil is a planar pair of loop-gap resonators.

8. A network of NMR receptors for simultaneously acquiring NMR signals from a predefined region of interest comprising:
   a first receptor having a first region of sensitivity which includes the region of interest and in which the reception field of the first receptor in the region of interest is substantially homogeneous, the first receptor producing a first output signal indicative of the NMR signals received;
   a second receptor having a second region of sensitivity which includes the region of interest, the second receptor being intrinsically isolated from homogeneous fields in the region of interest, whereby the second receptor is isolated from the first receptor with respect to the region of interest, the second receptor producing a second output signal indicative of the NMR signals received; and
   combining means connected to receive the output signals from the first and second receptors for producing a combined output based on the signals received from the first and second receptors.

9. The network of NMR receptors recited in claim 8 in which the second receptor is an intrinsically isolated local coil.

10. The network of NMR receptors recited in claim 9 in which the intrinsically isolated local coil includes a pair of loop-gap resonators arranged and interconnected to provide intrinsic isolation.

11. The network of NMR receptors recited in claim 10 in which the pair of loop-gap resonators are arranged and interconnected to form a Counter Rotating Current (CRC) pair of loop-gap resonators.

12. The network of NMR receptors recited in claim 10 in which the pair of loop-gap resonators are arranged and interconnected to form a planar pair of loop-gap resonators.

13. The network of NMR receptors recited in claim 8 in which the first receptor is an excitation coil operated in an excite/receive mode, and the network includes:

excitation means for providing an excitation signal; and switch means for connecting the excitation signal to the excitation coil during an excitation period and connecting the excitation coil to the combining means during a reception period.

14. The network of NMR receptors recited in claim 13 in which the excitation coil is a whole body coil in a whole body NMR scanner.

15. The network of NMR receptors recited in claim 13 in which the excitation coil is a head coil adapted for imaging the head of a human subject.

16. The network of NMR receptors recited in claim 13 in which the excitation coil is an extremity coil adapted for imaging an extremity of a human subject.

17. The network of NMR receptors recited in claim 9 in which the local coil is a quadrature probe comprised of two intrinsically isolated loop-gap resonator pairs.

18. The network of NMR receptors recited in claim 17 in which the two intrinsically isolated loop-gap resonator pairs are a CRC pair and a planar pair.

* * * * *